(12) United States Patent
Zhang

(10) Patent No.: US 7,391,262 B2
(45) Date of Patent: Jun. 24, 2008

(54) CIRCUIT AND METHOD FOR DRIVING BULK CAPACITANCE OF AMPLIFIER INPUT TRANSISTORS

(75) Inventor: Haoran Zhang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 204 days.

(21) Appl. No.: 11/410,367

(22) Filed: Apr. 25, 2006

(65) Prior Publication Data

US 2007/0247227 A1 Oct. 25, 2007

(51) Int. Cl.
*H03F 3/45* (2006.01)
(52) U.S. Cl. ...................................... 330/253
(58) Field of Classification Search ....................... None
See application file for complete search history.

(56) References Cited

U.S. PATENT DOCUMENTS

| | | | | |
|---|---|---|---|---|
| 4,667,164 | A * | 5/1987 | Doluca | 330/253 |
| 6,140,877 | A * | 10/2000 | Forbes | 330/258 |
| 6,346,858 | B1 * | 2/2002 | Forbes | 330/258 |
| 6,362,687 | B2 * | 3/2002 | Cox | 330/253 |

\* cited by examiner

*Primary Examiner*—Robert J. Pascal
*Assistant Examiner*—Krista M Flanagan
(74) *Attorney, Agent, or Firm*—Wade J. Brady, III; Frederick J. Telecky, Jr.

(57) ABSTRACT

Amplifier circuitry includes an input stage having a transconductance stage including first and second input transistors and a first tail current source, gates of the first and second input transistors being coupled to first and second input signals, respectively. A bulk electrode capacitance driver includes third and fourth input transistors and first and second associated cascode transistors and a second tail current source coupled to the sources and bulk electrodes of the third and fourth input transistors and to the bulk electrodes of the first and second input transistors. The gates of the third and fourth input transistors are coupled to the first and second input voltage signals, respectively, and the gates of the first and second cascode transistors are coupled to the second and first input voltage signals, respectively.

20 Claims, 4 Drawing Sheets

US 7,391,262 B2

CIRCUIT AND METHOD FOR DRIVING BULK CAPACITANCE OF AMPLIFIER INPUT TRANSISTORS

BACKGROUND OF THE INVENTION

The present invention relates generally to amplifier circuits, and more particularly to improving amplifier performance by overcoming difficulties caused by capacitance associated with the bulk electrodes of the input field effect transistors.

Bulk electrode capacitance associated with input stages of high-speed operational amplifiers reduces the amplifier slew rates and also causes unsymmetrical operational amplifier responses to the positive-going and negative-going edges of large-magnitude input step signals. Prior Art FIG. 1 illustrates an operational amplifier including a differential input transconductance stage 2 including input transistors 6A and 6B having their sources connected by conductor 8 to a tail current source 7. The bulk electrodes of input transistors 6A and 6B are connected by conductor 10 to the positive supply voltage VDD. The drains of input transistors 6A and 6B are connected to inputs of a prior art folded cascode stage 3, the outputs of which are connected to the inputs of a conventional class AB stage 4.

In the circuit of Prior Art FIG. 1, the bulk electrode capacitance Cb of the bulk electrodes of the input transistors does not significantly affect the signal path of the input signal (Vin=Vin+−Vin−) through the operational amplifier. However, the CMRR (common mode rejection ratio) of the operational amplifier is degraded due to mismatching between input transistors 6A and 6B, since the CMRR is a function of the source-drain voltages of the input transistors 6A and 6B.

Prior Art FIG. 2 shows another configuration of a similar transconductance input stage 2A in which the bulk electrodes of its of input transistors 6A and 6B are connected by conductor 10A to the common source conductor 8, rather than to VDD as in FIG. 1. A cascode transistor 11A is coupled between the drain of input transistor 6A and output conductor 9A, with its gate also connected to Vin−, and a cascode transistor 11B is coupled between the drain of input transistor 6B and output conductor 9B, with its gate connected to Vin+. Cascode transistors 11A and 11B provide improved CMRR of the operational amplifier by providing a relatively constant drain-source voltage across input transistors 6A and 6B. However, the circuit configuration of Prior Art FIG. 2 causes the bulk electrode capacitance Cb to be coupled so as to directly load the amplifier signal path, thereby degrading the large signal response of the amplifier by causing slower settling times and unsymmetrical slew rates.

Specifically, if the bulk electrodes of the input transistors are connected directly to their sources as shown in FIG. 2, the total bulk electrode capacitance Cb can be considered to be added directly to the signal path capacitance. This causes the above-mentioned unsymmetrical slewing operation wherein the rising edge of Vout is slower than the falling edge. For most operational amplifiers, the slew rate is determined by the total input stage tail current divided by the Miller compensation capacitance $C_M$. If all of the input stage tail current flows to the Miller compensation capacitance $C_M$, it does not matter whether that occurs in response to a rising edge or falling edge of the operational amplifier step input pulse. However, if the bulk electrode capacitance Cb of the input transistors 6A and 6B is connected directly to their sources, the total increased capacitance associated with the bulk electrodes of the input transistors 6A and 6B must be charged or discharged during slewing operation and therefore causes slower slewing rates.

During the rising edge of the amplifier input voltage, some of the tail current will go to the source capacitance of input transistors 6A and 6B, so less of the tail current is available to charge the Miller compensation capacitance $C_M$ of the operational amplifier output stage 4, resulting in a decreased slew rate.

During the falling edge of the input step pulse, the voltage of the common source conductor 8 of input transistors 6A and 6B will decrease. The total capacitance on common source conductor 8, including source capacitances of input transistors 6A and 6B and the total bulk electrode capacitance Cb, will be discharged through input transistors 6A and 6B and conductors 9A and 9B and through the signal path of the folded cascode stage 3 to the Miller compensation capacitances $C_M$ and will produce a current that is substantially greater in magnitude than the tail current I1 of input stage 2A. This causes a substantially faster slew rate than for the rising edge of the input step voltage pulse. Thus, the slewing rates in response to the rising and falling edges of a step voltage input pulse are unsymmetrical.

Conventional buffer circuits may have been previously used to drive the bulk electrodes of operational amplifier input stage field effect transistors, but if so, it would have been found that this approach has significant difficulties because some of the tail current of the conventional buffer circuit would have been leaked to the integrated circuit substrate or ground, i.e., wasted, and therefore resulting in less of the tail current being available to drive the bulk electrode capacitance Cb. This would have resulted in excessive power consumption if the tail current had been substantially increased to drive the bulk electrode capacitance in order to increase output slew rates.

Thus, there is an unmet need for an amplifier input stage that provides symmetrical slew rates.

There also is an unmet need for an amplifier input stage that provides symmetrical slew rates and fast signal settling times.

There also is an unmet need for an amplifier input stage that provides symmetrical slew rates and fast signal settling times without unacceptably increasing power consumption.

SUMMARY OF THE INVENTION

It is an object of the invention to provide an amplifier input stage that provides symmetrical slew rates.

It is another object of the invention to provide an operational amplifier including a transconductance input stage that provides symmetrical amplifier slew rates and fast signal settling times.

It is another object of the invention to provide an operational amplifier including an input stage that provides symmetrical amplifier slew rates and fast signal settling times without unacceptably increasing power consumption.

Briefly described, and in accordance with one embodiment, the present invention provides amplifier circuitry (100) having an input stage (2B) which includes a transconductance stage (2C) including first (6A) and second (6B) input transistors each having a source, a drain, a gate, and a bulk electrode, and a first tail current source (I1) coupled to the sources of the first (6A) and second (6B) input transistors, the gates of the first (6A) and second (6B) input transistors being coupled to first (Vin−) and second (Vin+) input voltage signals, respectively. The input stage (2B) also includes a bulk electrode capacitance driver circuit (15) including third (60A) and fourth (60B) input transistors and first (111A) and second (111B) cascode transistors each having a source, a drain, a gate, and a bulk electrode, and a second tail current source (I2) coupled to the sources and bulk electrodes of the third (60A)

and fourth (60B) input transistors and also to the bulk electrodes of the first (6A) and second (6B) input transistors. The gates of the third (60A) and fourth (60B) input transistors are coupled to the first (Vin−) and second (Vin+) input voltage signals, respectively. The gates of the first (111A) and second (111B) cascode transistors are cross-coupled to the second (Vin+) and first (Vin−) input voltage signals, respectively. The source and drain of the first cascode transistor (111A) are coupled to the drain of the third input transistor (60A) and a reference voltage conductor (GND), respectively, and the source and drain of the second cascode transistor (111B) are coupled to the drain of the fourth input transistor (60B) and the reference voltage conductor (GND), respectively. A first output conductor (9A) is coupled to the drain of the first input transistor (6A) and a second output conductor (9B) is coupled to the drain of the second input transistor (6B).

In the described embodiment, the transconductance stage (2C) includes third (11A) and fourth (11B) cascode transistors, wherein a source and drain of the third cascode transistor (11A) are coupled to the drain of the first input transistor (6A) and the first output conductor (9A), respectively. A source and drain of the fourth cascode transistor (11B) are coupled to the drain of the second input transistor (6B) and the second output conductor (9B), respectively. Gates of the third (11A) and fourth (11B) cascode transistors are coupled to the first (Vin−) and second (Vin+) input voltage signals, respectively. The first (9A) and second (9B) output conductors are coupled to inputs of a folded cascode stage (3), the output of which is coupled to the input of a class AB output stage (4).

In one embodiment, the invention provides a method of operating an amplifying circuit to improve speed and symmetry of slewing operation, including providing a transconductance stage (2C) including first (6A) and second (6B) input transistors and a first tail current source (I1) coupled to sources of the first (6A) and second (6B) input transistors, drains of the first (6A) and second (6B) input transistors being coupled to first (9A) and second (9B) output conductors, respectively, of the transconductance stage, and providing a bulk electrode capacitance driver circuit (15) including third (60A) and fourth (60B) input transistors and first (111A) and second (111B) cascode transistors and a second tail current source (I2) coupled to the sources and bulk electrodes of the third (60A) and fourth (60B) input transistors and also to bulk electrodes of the first (6A) and second (6B) input transistors, drains of the first (111A) and second (111B) cascode transistors being coupled to a reference voltage conductor (GND), sources of the first (111A) and second (111B) cascode transistors being coupled to drains of the third (60A) and fourth (60B) input transistors, respectively. This embodiment of the invention also includes applying first (Vin−) and second (Vin+) signals which constitute a differential input signal (Vin) of at least a predetermined magnitude between various gates of the first (6A), second (6B), third (60A) and fourth (60B) input transistors and the first (111A) and second (111B) cascode transistors to either (1) simultaneously turn on the first (6A) and third (60A) input transistors and the second (111B) cascode transistor and turn off the second (6B) and fourth (60B) input transistors and the first (111A) cascode transistor, or (2) simultaneously turn the first (6A) and third (60A) input transistors and the second (111B) cascode transistor off and turn on the second (6B) and fourth (60B) input transistor and the first (111A) cascode transistors, depending on the polarity of the differential input signal (Vin), so as to prevent tail current from the second tail current source (I2) from flowing into the reference voltage conductor (GND) and being wasted while the magnitude of the input signal (Vin) exceeds the predetermined magnitude.

In one embodiment, the invention provides circuitry (100) including a transconductance stage (2C) which includes first (6A) and second (6B) input transistors and a first tail current source (I1) coupled to sources of the first (6A) and second (6B) input transistors, drains of the first (6A) and second (6B) input transistors being coupled to first (9A) and second (9B) output conductors, respectively, of the transconductance stage. A bulk electrode capacitance driver circuit (15) includes third (60A) and fourth (60B) input transistors and first (111A) and second (111B) cascode transistors and a second tail current source (I2) coupled to the sources and bulk electrodes of the third (60A) and fourth (60B) input transistors and also to bulk electrodes of the first (6A) and second (6B) input transistors, drains of the first (111A) and second (111B) cascode transistors being coupled to a reference voltage conductor (GND), sources of the first (111A) and second (111B) cascode transistors being coupled to drains of the third (60A) and fourth (60B) input transistors, respectively. This embodiment of the invention also includes means for applying first (Vin−) and second (Vin+) signals which constitute a differential input signal (Vin) of at least a predetermined magnitude between various gates of the first (6A), second (6B), third (60A) and fourth (60B) input transistors and the first (111A) and second (111B) cascode transistors to either (1) simultaneously turn on the first (6A) and third (60A) input transistors and the second (111B) cascode transistor and turn off the second (6B) and fourth (60B) input transistors and the first (111A) cascode transistor, or (2) simultaneously turn the first (6A) and third (60A) input transistors and the second (111B) cascode transistor off and turn on the second (6B) and fourth (60B) input transistor and the first (111A) cascode transistors, depending on the polarity of the differential input signal (Vin), so as to prevent tail current from the second tail current source (I2) from flowing into the reference voltage conductor (GND) and being wasted while the magnitude of the input signal (Vin) exceeds the predetermined magnitude.

DETAILED DESCRIPTION OF THE PREFERRED EMBODIMENTS

The present invention provides a low-power bulk electrode driver circuit for driving the bulk electrodes of the input transistors of an amplifier circuit. When the capacitance Cb associated with the bulk electrodes is driven by the bulk electrode driver circuit, the bulk electrode capacitance has minimal effect on the main signal path through the amplifier. This results in substantial improvements in the slew rates and settling times of the amplifier, and also results in more symmetrical slew rates of the amplifier circuit.

Figure 1:
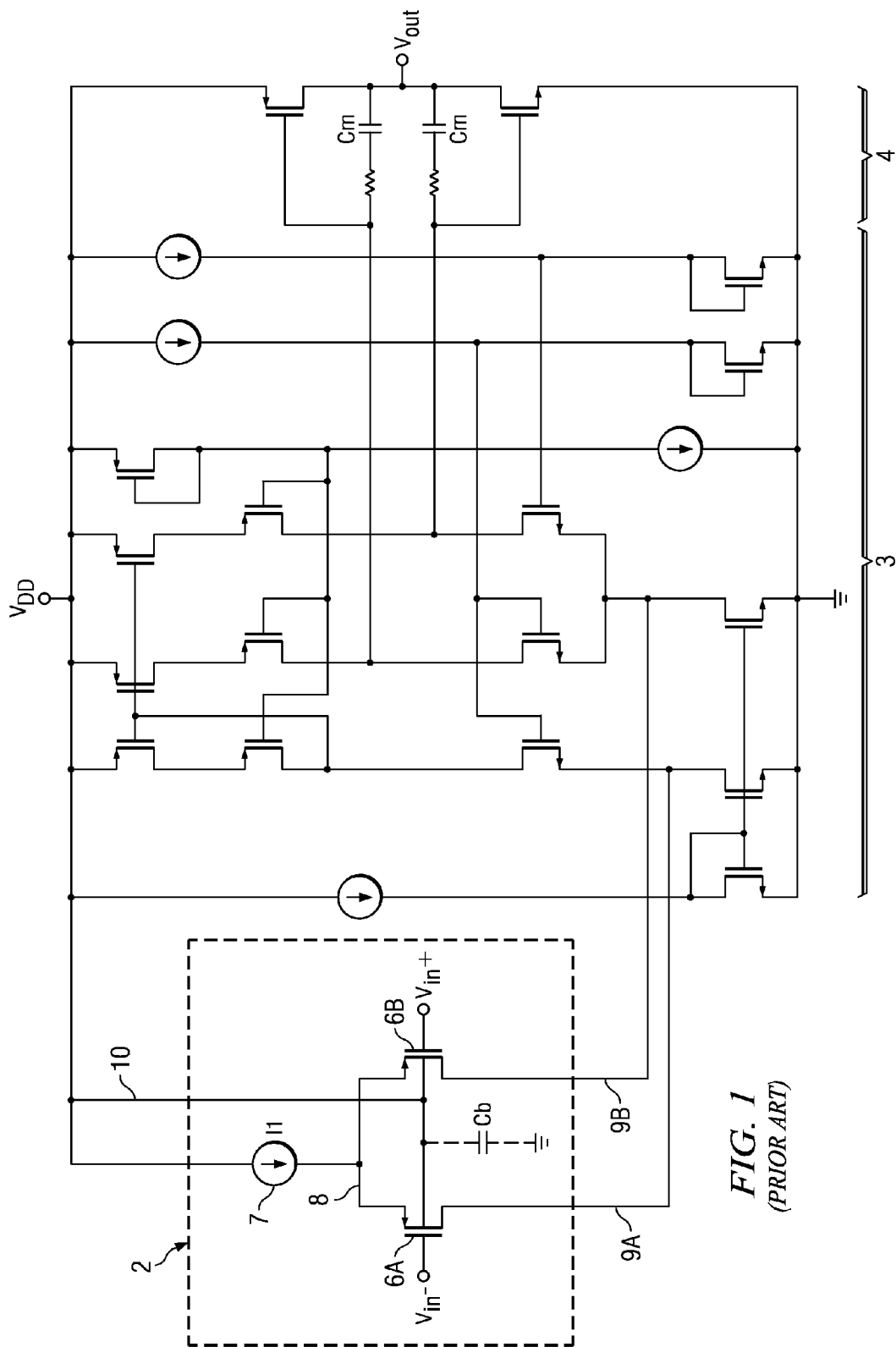
FIG. 1 is a schematic diagram of a prior art operational amplifier in which the bulk electrodes of the input stage transistors are connected to the positive supply voltage.
Figure 2:
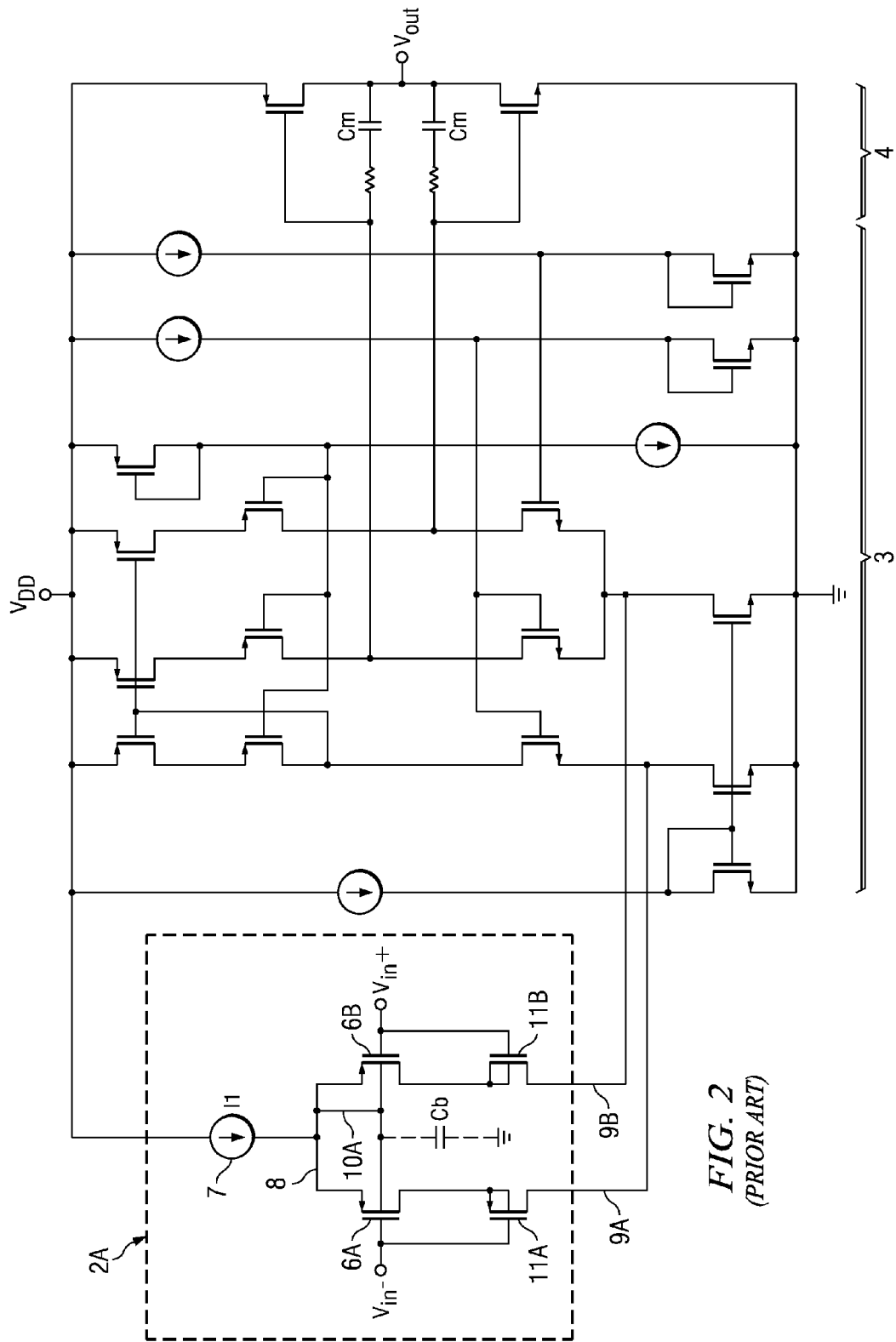
FIG. 2 is a schematic diagram of a prior art operational amplifier in which the bulk electrodes of the input stage transistors are connected to their source electrodes.
Figure 3:
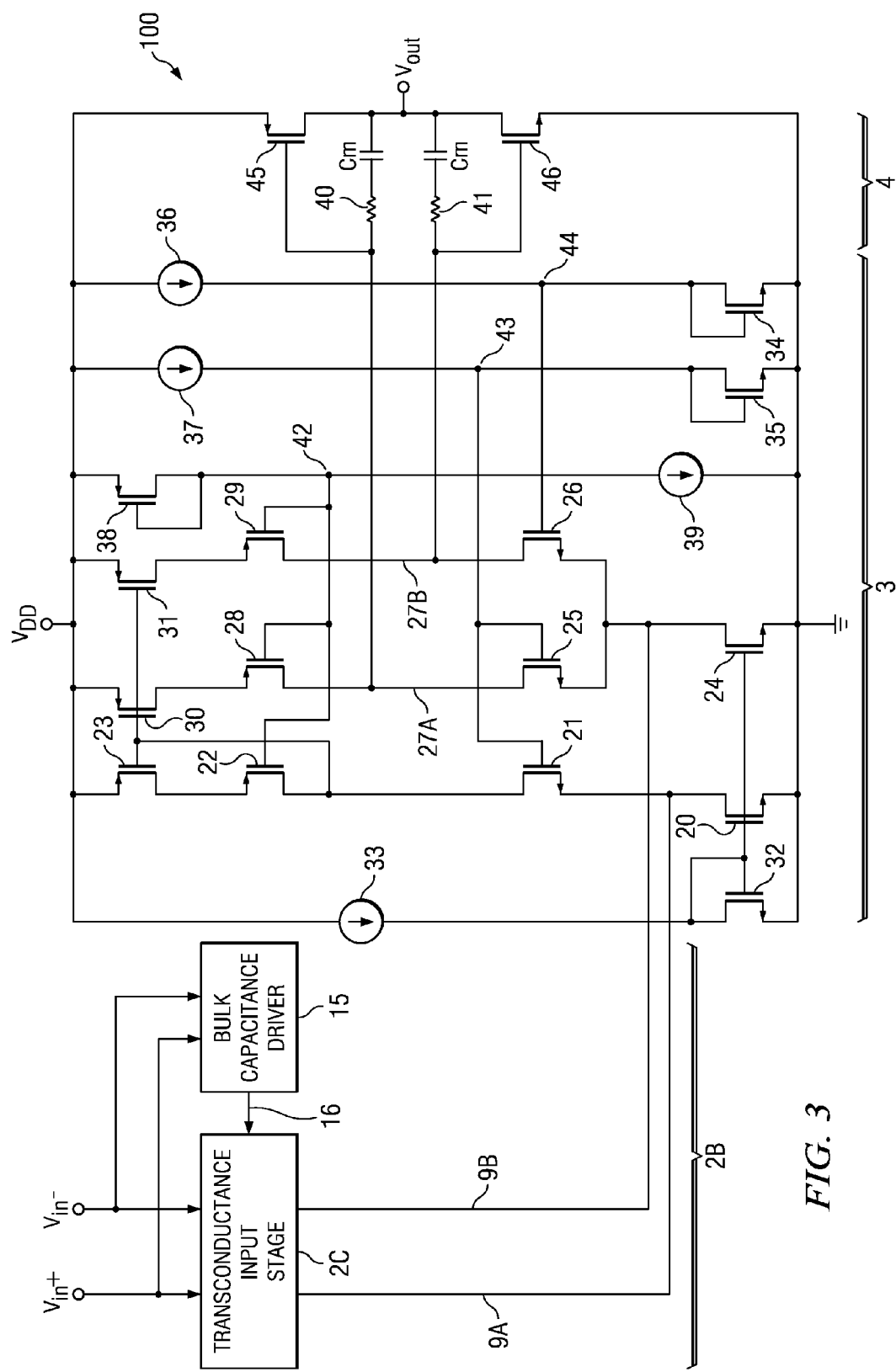
FIG. 3 is a schematic diagram of an operational amplifier including a bulk electrode driver circuit in accordance with the present invention.

FIG. 3 shows an amplifier 100 including an input stage 2B which drives a known prior art folded cascode stage 3 that is followed by a conventional class AB output stage 4. Input stage 2B includes a transconductance input stage 2C which receives input signals Vin+ and Vin– and, in response thereto, produces output currents in conductors 9A and 9B. In accordance with the present invention, input stage 2B also includes bulk capacitance driver circuit 15, which also receives input signals Vin+ and Vin–, and, in response thereto, produces a signal on conductor 16, which is connected to the bulk electrodes of, and drives the bulk capacitance Cb associated with, the bulk electrodes of the input transistors of both transconductance input stage 2C and bulk capacitance driver circuit 15. The details of transconductance input stage 2C and bulk capacitance driver 15 are shown in FIG. 4.

Figure 4:
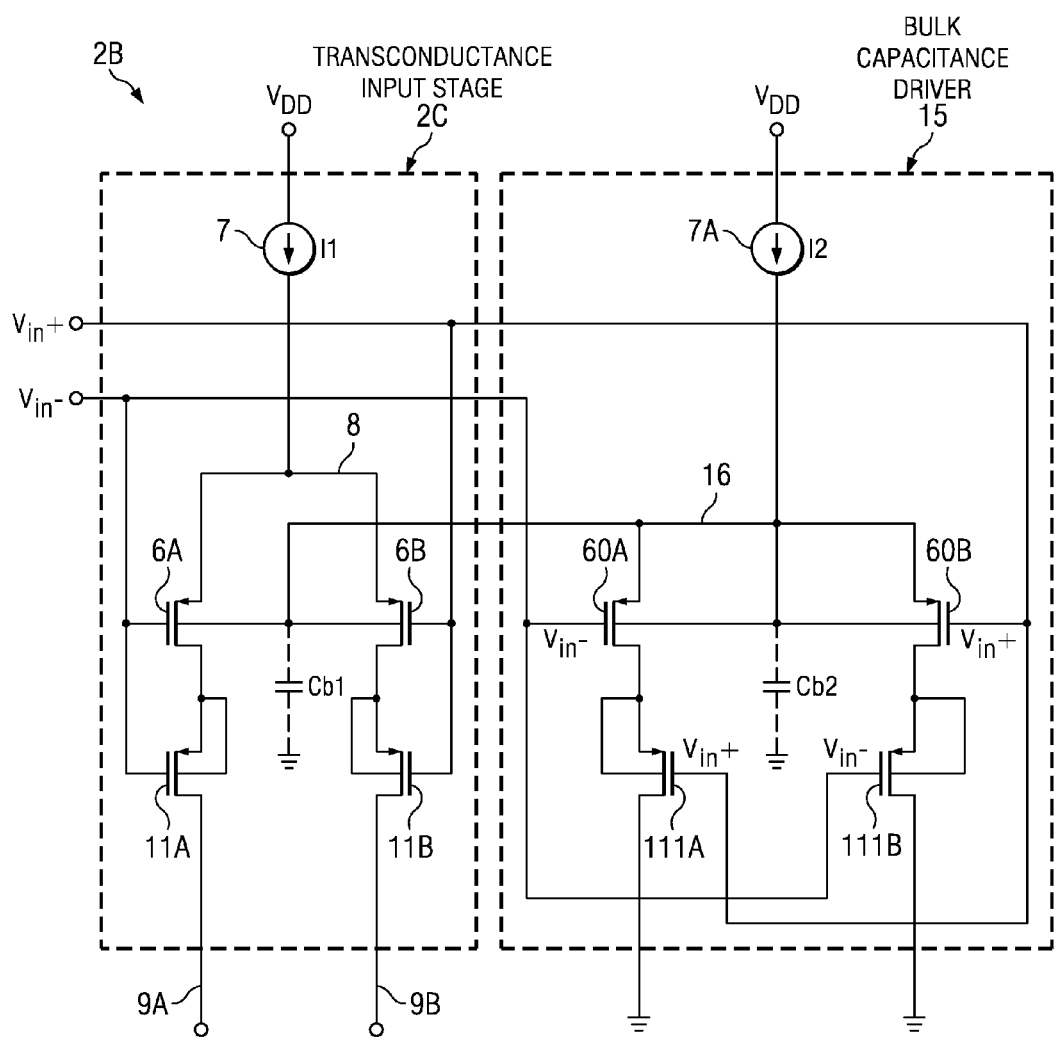
FIG. 4 is an enlarged schematic diagram of the input stage and bulk driver circuit shown in FIG. 3.

Referring to FIG. 4, transconductance input stage 2C includes tail current source 7 coupled between VDD and a common source conductor 8 that is connected to the source electrodes of P-channel input transistors 6A and 6B. Tail current source 7 supplies a constant tail current I1 to the sources of input transistors 6A and 6B. The gates of input transistors 6A and 6B are connected to Vin– and Vin+, respectively. The bulk electrodes of input transistors 6A and 6B, which have an associated bulk capacitance Cb1, are connected to bulk capacitance driver output conductor 16. The drain of input transistor 6A is connected to the source and bulk electrodes of a P-channel cascode transistor 11A. The gate of cascode transistor 11A is connected to Vin– and its drain is connected to conductor 9A. The drain of input transistor 6B is connected to the source and bulk electrodes of a P-channel cascode transistor 11B, and the gate of cascode transistor 11B is connected to Vin+ and its drain is connected to conductor 9B. (Note that use of cascode transistors 11A and 11B substantially improves the CMRR of operational amplifier 100, but these transistors can be omitted if CMRR is acceptable without them.)

Bulk capacitance driver circuit 15 includes tail current source 7A coupled between VDD and bulk driver circuit output conductor 16, which is also connected to the source and bulk electrodes of P-channel input transistors 60A and 60B of bulk capacitance driver circuit 15. Tail current source 7A produces a constant tail current I2 which is scaled relative to tail current I1 of transconductance input stage 2C. A parasitic bulk capacitance Cb2 is associated with the bulk electrodes of input transistors 60A and 60B. The gate electrode of input transistor 60A is connected to Vin– and the gate electrode of input transistor 60B is connected to Vin+, where a differential input signal Vin to be amplified by operational amplifier 100 is given by the expression Vin=Vin+–Vin–. The source and bulk electrodes of a P-channel cascode transistor 111A are connected to the drain of input transistor 60A, and the gate of cascode transistor 111A is connected to Vin+. The source and bulk electrodes of a P-channel cascode transistor 111B are connected to the drain of input transistor 60B, and the gate of cascode transistor 111B is connected to Vin–. The drains of cascode transistors 111A and 111B are connected to ground.

Thus, the gates of cascode transistors 111A and 111B can be considered to be "cross-coupled" to Vin+ and Vin– relative to the way the gates of input transistors 60A and 60B are coupled to Vin– and Vin+.

The various transistor geometries are selected such that the current densities in input transistors 60A and 60B of bulk electrode driver circuit 15 are essentially the same as in the corresponding input transistors 6A and 6B of transconductance input stage 2C. Consequently, the VGS (gate-to-source) voltages and the bulk-to-source voltages of input transistors 6A and 6B of transconductance input stage 2C are very close to the corresponding VGS voltages of input transistors 60A and 60B of bulk capacitance driver 15. Therefore, the voltage on common source conductor 8 in transconductance input stage 2C is very close to the voltage produced on bulk capacitance driver output conductor 16. However, it should be noted that the main advantages of this invention, including faster, more symmetrical slewing are achieved, without substantially increased power dissipation, even if the current densities in 6A, 6B, 60A and 60B and their VGS voltages are somewhat unequal.

Under "large signal transient" conditions wherein the difference between Vin+ and Vin– and the "cross-coupled" connection of cascode transistors 111A and 111B to Vin+ and Vin–, respectively, prevents any of the tail current I2 of bulk capacitance driver circuit 15 from flowing into ground. (See the earlier discussion of problems of using a conventional buffer to drive bulk electrodes of field effect input transistors.) For example, if the transient difference between Vin+ and Vin– causes input transistor 60B to be turned off, then cascode transistor 111A will also be turned off. Therefore, even though input transistor 60A is turned on hard, cascode transistor 111A will be turned off. Consequently, even though input transistor 60A is turned on hard, cascode transistor 111A blocks any of the tail current I2 from flowing through input transistor 60A to ground. Since both input transistor 60B and cascode transistor 111A are off during the transient, all of the tail current I2 flows into the parasitic bulk capacitances Cb1 and Cb2, which is the ideal situation because none of tail current I2 is "wasted" by flowing into ground. Power consumption of bulk capacitance driver 15 therefore is minimized, because only a minimal amount of tail current I2 is used to drive the bulk capacitances Cb1 and Cb2.

The above operation is in direct contrast to operation which would be achieved if an ordinary buffer were to be used to drive the bulk capacitance Cb1 of transconductance input stage 2C. For example, without the cross-coupling of the gates of cascode transistors 111A and 111B shown in bulk driver circuit 15 of FIG. 4 (that is, if the gates of cascode transistors 11A and 111B are connected to Vin– and Vin+ instead of as shown in FIG. 4), a large positive transient swing of Vin+ relative to Vin– would turn input transistor 60B and cascode transistor 111B off and would cause input transistor 60A and cascode transistor 111A to be turned on. Initially, all of the tail current 7A would flow through conductor 16 toward transistor 60A, causing the voltage of conductor 16 to rise during the transient. Without the cross-coupling of the present invention, some of the constant tail current I2 would flow through input transistor 60A and cascode transistor 111A (both of which would be turned on) to ground during the transient and the rest would flow into bulk electrode capacitances Cb1 and Cb2 as the source voltage on conductor 16 would continue to rise until the end of the transient, after which the tail current 7A all would flow through input transistor 60A and cascode transistor 111A to ground. More specifically, as transistors 60B and 111B are turned off, a current equal to one half of tail current I2 begins immediately to charge the bulk electrode capacitances Cb1 and Cb2. Then the voltage on conductor 16 starts to rise faster than the voltage on the gate of transistor 60A, turning it on harder. That causes more of the tail current I2 to flow through transistor 60A to ground and therefore be wasted, and also causes less of the tail current I2 to be available to continue charging bulk electrode capacitances Cb1 and Cb2.

Thus, the maximum current available to charge the bulk electrodes of the input transistors would be one half of the tail current I2, and it would diminish as the voltage on conductor 16 changes. By the end of this process, there would be no current charging the bulk electrode capacitances Cb1 and Cb2, as all of the tail current I2 would flow through transistor 60A. All of the current which would flow to ground during the transient would have been wasted, resulting in substantially slower charging of the bulk electrode capacitances.

In contrast, in the cross-coupled configuration shown in bulk electrode driver circuit 15 of FIG. 4, all of the parasitic bulk capacitance Cb1 and Cb2 of input transistors 6A, 6B, 60A, and 60B are driven by the constant tail current I2, so the bulk electrode capacitances Cb1 and Cb2 have relatively little effect on the large signal transient response of operational amplifier 100 of FIGS. 3 and 4. Symmetrical slewing and fast settling times of operational amplifier 100 therefore are achieved with use of a relatively small amount of additional integrated circuit chip area and with a relatively low additional amount of current compared to the additional amount that would be required if the connections between input transistors 60A and 60B and Vin+ and Vin− were to be reversed so that the connections were not "cross-coupled".

It should be noted that if a conventional buffer is used instead of bulk capacitance driver 15, it is likely to be more complex than the four-transistor bulk capacitance driver circuit 15 of FIG. 4, and it may have to be biased by a greater tail current (and hence have greater power dissipation) to make up for the current that would be wasted without the cross-coupled transistors 111A and 111B, in order for the operational amplifier to have the same slewing performance as operational amplifier 100 of FIG. 3.

The circuit configuration of bulk capacitance driver 15 is very simple compared to a conventional buffer circuit that one skilled in the art might consider using to drive the bulk electrodes of input transistors 6A and 6B, and may use substantially less current than would be required by a conventional buffer circuit. Furthermore, bulk electrode driver circuit 15 has rail-to-rail voltage swing capability.

Referring again to FIG. 3, known folded cascode circuit 3 includes an N-channel current mirror which includes a diode-connected current mirror control transistor 32, the drain and gate of which are connected to current source 33, and also includes N-channel current mirror output transistors 20 and 24, the sources of which are connected to ground. The drain of transistor 20 is connected by conductor 9A to the source of N-channel cascode transistor 21, the drain of which is connected to the drain of P-channel cascode transistor 22 and to the gates of P-channel current mirror transistors 23, 30 and 31, the sources of which are connected to VDD. The drain of transistor 24 is connected by conductor 9B to the sources of N-channel cascode transistors 25 and 26, which split the current through transistor 24. Current mirror output transistors 20 and 24 can be considered to be active load devices of transconductance input stage 2C which converts the signal currents in conductors 9A and 9B to corresponding voltages on the drain of cascode transistor 21 and on the drains of N-channel cascode transistors 25 and 26.

The drain of cascode transistor 25 is connected by conductor 27A to the drain of P-channel cascode transistor 28, the source of which is connected to the drain of current mirror output transistor 30. The drain of cascode transistor 26 is connected by conductor 27B to the drain of P-channel cascode transistor 29, the source of which is connected to the drain of current mirror transistor 31. The gates of cascode transistors 21 and 25 are biased by a reference voltage produced on conductor 43 by a reference voltage circuit including current source 37 coupled by conductor 43 to the gate and drain of N-channel transistor 35, the source of which is connected to ground. The gate of cascode transistor 26 is biased by a reference voltage produced on conductor 44 by a reference circuit including current source 36 which is also coupled by conductor 44 to the drain and gate of N-channel transistor 34, the source of which is connected to ground. The gates of P-channel cascode transistors 22, 28 and 29 are biased by a reference voltage on conductor 42 produced by a reference voltage circuit including a current source 39 coupled by conductor 42 to the drain and gate of a P-channel transistor 38 having its source connected to VDD.

Class AB stage 4 includes P-channel output transistor 45 having its source connected to VDD, its gate connected to conductor 27A, and its drain connected to Vout. A Miller compensation capacitor $C_M$ is coupled in series with a low-value resistor 40 between the gate and drain of output transistor 45. A N-channel transistor 46 has its source connected to ground, its drain connected to Vout, and its gate connected to conductor 27B. A Miller compensation capacitor $C_M$ is coupled in series with a low-value resistor 41 between the gate and drain of output transistor 46. Low value resistors 40 and 41 are provided in series with the Miller gate-drain capacitances $C_M$ associated with class AB output transistors 45 and 46 to ensure amplifier stability. Transistors 24, 25, 26, 28, 29, 30 and 31 operate to split the current through current mirror output transistor, 24 causing the signal on conductor 27A to drive P-channel output transistor 45 and causing the signal on conductor 27B to drive N-channel output transistor 46. The currents through current mirror output transistors 20 and 24 can be considered to be DC currents, and the AC signal current in conductor 9A can be considered to flow through cascode transistor 21, and the AC signal currents in conductor 9B can be considered to be split through cascode transistors 25 and 26, respectively. The currents of current sources 36 and 37 are selected so that the voltages on the gates of transistors 25 and 26 cause the gate voltage of the P-channel output transistor 45 to be higher than the gate voltage of N-channel output transistor 46 so as to prevent overly large currents from flowing through both of output transistors 45 and 46, to thereby provide ordinary class AB output stage control.

It should be appreciated that input stage 2B of FIGS. 3 and 4 may be used in conjunction with a variety of other kinds of output stages.

Preferably, the tail current source 7A, input transistors 60A and 60B, and cascode transistors 111A and 111B of bulk capacitance driver 15 are substantially smaller than, and scaled by a suitable ratio to, tail current source 7, input transistors 6A and 6B, and cascode transistors 11A and 11B, respectively, of transconductance input circuit 2C. Specifically, tail current source 7A, input transistors 60A and 60B, and cascode transistors 111A and 111B preferably are scaled relative to current source 7, input transistors 6A and 6B, and cascode transistors 11A and 11B, respectively, by a ratio such that the VGS voltages of input transistors 6A and 6B of transconductance input stage 2A are equal to the corresponding VGS voltages of input transistors 60A and 60B of bulk driver circuit 15, respectively, so that the bulk voltage of input transistors 6A and 6B on conductor 16 is essentially equal to the source voltage on common source conductor 8.

After a large voltage transient is over, input transistors 60A and 60B and input transistors 6A and 6B are turned on equally, and cascode transistors 111A and 111B also are turned on equally. Under these conditions, the "cross coupling" of cascode transistors 111A and 111B is of no effect. Therefore, the cross coupling is very advantageous during transitions, and has no disadvantages during stable, i.e. non-transient, conditions.

Thus, the bulk electrode driver of the present invention has the advantages that it does not cause loading of the signal path of an amplifier, allows use of a small value of tail current I2 to accomplish driving the bulk terminals of the input transistors of the amplifier, thereby reducing power dissipation, and provides faster signal settling times and faster and more symmetrical slewing operation of the operational amplifier.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. Amplifier circuitry including an input stage comprising:
   (a) a transconductance stage including first and second input transistors each having a source, a drain, a gate, and a bulk electrode, and a first tail current source coupled to the sources of the first and second input transistors, the gates of the first and second input transistors being coupled to first and second input voltage signals, respectively;
   (b) a bulk electrode capacitance driver circuit including third and fourth input transistors and first and second cascode transistors each having a source, a drain, a gate, and a bulk electrode, and a second tail current source coupled to the sources and bulk electrodes of the third and fourth input transistors and also to the bulk electrodes of the first and second input transistors, the gates of the third and fourth input transistors being coupled to the first and second input voltage signals, respectively, the gates of the first and second cascode transistors being cross-coupled to the second and first input voltage signals, respectively, the source and drain of the first cascode transistor being coupled to the drain of the third input transistor and a reference voltage conductor, respectively, the source and drain of the second cascode transistor being coupled to the drain of the fourth input transistor and the reference voltage conductor, respectively; and
   (c) a first output conductor coupled to the drain of the first input transistor and a second output conductor coupled to the drain of the second input transistor.

2. The amplifier circuitry of claim 1 wherein the transconductance stage includes third and fourth cascode transistors, a source and drain of the third cascode transistor being coupled to the drain of the first input transistor and the first output conductor, respectively, a source and drain of the fourth cascode transistor being coupled to the drain of the fourth input transistor and the second output conductor, respectively, gates of the third and fourth cascode transistors being coupled to the first and second input voltage signals, respectively.

3. The amplifier circuitry of claim 1 wherein the first and second output conductors are coupled to inputs of a folded cascode stage.

4. The amplifier circuitry of claim 3 wherein an output of the folded cascode stage is coupled to an input of a class AB output stage.

5. The amplifier circuitry of claim 2 wherein the first, second, third, and fourth input transistors are junction field effect transistors (JFETs).

6. The amplifier circuitry of claim 2 wherein the first, second, third, and fourth input transistors are P-channel JFETs.

7. The amplifier circuitry of claim 6 wherein the first, second, third and fourth cascode transistors are P-channel JFETs.

8. The amplifier circuitry of claim 2 wherein the first and second tail current sources are scaled with a predetermined ratio such that current produced by the second tail current source is substantially smaller than current produced by the first tail current source.

9. The amplifier circuitry of claim 8 wherein geometry ratios of the first and second input transistors are scaled with geometry ratios of the third and fourth input transistors in accordance with the predetermined ratio.

10. The amplifier circuitry of claim 9 wherein the predetermined ratio is selected such that current densities in the first, second, third and fourth input transistors are substantially equal.

11. The amplifier circuitry of claim 9 wherein the predetermined ratio is selected such that gate-to-source voltages of the first, second, third and fourth input transistors are substantially equal.

12. The amplifier circuitry of claim 10 wherein an operating voltage of the sources of the first and second input transistors is substantially equal to an operating voltage produced by the bulk electrode capacitance driver circuit on the bulk electrodes of the first and second input transistors.

13. A method of operating an amplifying circuit to improve speed and symmetry of its slewing operation, the method comprising:
   (a) providing a transconductance stage including first and second input transistors and a first tail current source coupled to sources of the first and second input transistors, drains of the first and second input transistors being coupled to first and second output conductors, respectively, of the transconductance stage;
   (b) providing a bulk electrode capacitance driver circuit including third and fourth input transistors and first and second cascode transistors and a second tail current source coupled to sources and bulk electrodes of the third and fourth input transistors and also to bulk electrodes of the first and second input transistors, drains of the first and second cascode transistors being coupled to a reference voltage conductor, sources of the first and second cascode transistors being coupled to drains of the third and fourth input transistors, respectively; and
   (c) applying first and second signals which constitute a differential input signal of at least a predetermined magnitude between various gates of the first, second, third and fourth input transistors and the first and second cascode transistors to either
      i. simultaneously turn on the first and third input transistors and the second cascode transistor and turn off the second and fourth input transistors and the first cascode transistor, or
      ii. simultaneously turn the first and third input transistors and the second cascode transistor off and turn on the second and fourth input transistors and the first cascode transistor,
   depending on the polarity of the differential input signal, so as to prevent tail current from the second tail current source from flowing into the reference voltage conductor and being wasted while the magnitude of the input signal exceeds the predetermined magnitude.

14. The method of claim 13 including coupling the drain of the first input transistor to the first output conductor by means of a third cascode transistor and coupling the drain of the second input transistor to the second output conductor by means of a fourth cascode transistor.

15. The method of claim 14 including applying the first and second signals to gates of the third and fourth cascode transistors, respectively.

16. The method of claim 13 including coupling the first and second output conductors to inputs of a folded cascode stage.

17. The method of claim 16 including coupling an output of the folded cascode stage to an input of a class AB output stage.

18. The method of claim 13 including scaling geometry ratios of the first and second input transistors at a predetermined ratio with respect to geometry ratios of the third and fourth input transistors such that current densities in the first, second, third and fourth input transistors are substantially equal.

19. The method of claim 18 including operating the amplifying circuit to cause the sources of the first and second input transistors to be at a voltage which is substantially equal to a voltage produced by the bulk electrode capacitance driver circuit on the bulk electrodes of the first and second input transistors.

20. Amplifier circuitry comprising:
   (a) a transconductance stage including first and second input transistors and a first tail current source coupled to sources of the first and second input transistors, drains of the first and second input transistors being coupled to first and second output conductors, respectively, of the transconductance stage;
   (b) a bulk electrode capacitance driver circuit including third and fourth input transistors and first and second cascode transistors and a second tail current source coupled to sources and bulk electrodes of the third and fourth input transistors and also to bulk electrodes of the first and second input transistors, drains of the first and second cascode transistors being coupled to a reference voltage conductor, sources of the first and second cascode transistors being coupled to drains of the third and fourth input transistors, respectively; and
   (c) means for applying first and second signals which constitute a differential input signal of at least a predetermined magnitude between various gates of the first, second, third and fourth input transistors and the first and second cascode transistors to either
      i. simultaneously turn on the first and third input transistors and the second cascode transistor and turn off the second and fourth input transistors and the first cascode transistor, or
      ii. simultaneously turn the first and third input transistors and the second cascode transistor off and turn on the second and fourth input transistors and the first cascode transistor,
   depending on the polarity of the differential input signal, so as to prevent tail current from the second tail current source from flowing into the reference voltage conductor and being wasted while the magnitude of the input signal exceeds the predetermined magnitude.

* * * * *